(12) United States Patent
Hwang

(10) Patent No.: US 10,270,472 B2
(45) Date of Patent: Apr. 23, 2019

(54) APPARATUS AND METHOD FOR TRANSMITTING/RECEIVING FORWARD ERROR CORRECTION PACKET IN MOBILE COMMUNICATION SYSTEM

(71) Applicant: Samsung Electronics Co., Ltd., Suwon-si, Gyeonggi-do (KR)

(72) Inventor: Sung-Hee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 13/650,408

(22) Filed: Oct. 12, 2012

(65) Prior Publication Data

US 2013/0094502 A1     Apr. 18, 2013

(30) Foreign Application Priority Data

Oct. 13, 2011    (KR) .................. 10-2011-0104888

(51) Int. Cl.
*H04L 1/00*      (2006.01)
*H03M 13/00*     (2006.01)
(Continued)

(52) U.S. Cl.
CPC ..... *H03M 13/2707* (2013.01); *H03M 13/618* (2013.01); *H03M 13/6362* (2013.01);
(Continued)

(58) Field of Classification Search
CPC ............................ H04L 1/0084; H04L 1/0078
(Continued)

(56) References Cited

U.S. PATENT DOCUMENTS 6,307,487 B1    10/2001  Luby
2003/0226092 A1 12/2003  Kim et al.
(Continued)

FOREIGN PATENT DOCUMENTS

CN    101512989 A    8/2009
CN    101563874 A    10/2009
(Continued)

OTHER PUBLICATIONS

Wenger et al., RTP Payload Format for H.264 Video, Feb. 2005, pp. 1-83.
(Continued)

*Primary Examiner* — Redentor Pasia
(74) *Attorney, Agent, or Firm* — Jefferson IP Law, LLP

(57) ABSTRACT

An apparatus and method for transmitting/receiving a Forward Error Correction (FEC) packet in a mobile communication system are provided. In the FEC packet transmission method, an FEC packet transmission apparatus transmits an FEC delivery block to an FEC packet reception apparatus. The FEC delivery block includes N payloads. Each of the N payloads includes a payload header. Each payload header included in each of C payloads among the N payloads includes packet oriented header information and an FEC delivery block oriented header information fragment. The packet oriented header information is applied to a related payload, and the FEC delivery block oriented header information fragment is generated by fragmenting FEC delivery block oriented header information applied to the N payloads.

2 Claims, 10 Drawing Sheets

(51) Int. Cl.
*H03M 13/11* (2006.01)
*H03M 13/15* (2006.01)
*H03M 13/27* (2006.01)

(52) U.S. Cl.
CPC .......... *H04L 1/0041* (2013.01); *H04L 1/0083* (2013.01); *H03M 13/1102* (2013.01); *H03M 13/1515* (2013.01)

(58) Field of Classification Search
USPC .......... 370/469–470, 473–476; 714/751–752
See application file for complete search history.

(56) References Cited

U.S. PATENT DOCUMENTS

| | | | |
|---|---|---|---|
| 2004/0170201 A1* | 9/2004 | Kubo et al. | 370/535 |
| 2007/0217499 A1* | 9/2007 | Limberg | 375/240 |
| 2007/0300127 A1* | 12/2007 | Watson | H03M 13/03 714/758 |
| 2008/0049789 A1* | 2/2008 | Vedantham et al. | 370/474 |
| 2008/0219287 A1 | 9/2008 | Krueger et al. | |
| 2009/0092076 A1 | 4/2009 | Zheng et al. | |
| 2009/0276686 A1* | 11/2009 | Liu | H04L 1/0041 714/776 |
| 2009/0327842 A1 | 12/2009 | Liu et al. | |
| 2010/0050057 A1* | 2/2010 | Luby | 714/776 |
| 2010/0223533 A1* | 9/2010 | Stockhammer | H03M 13/373 714/776 |
| 2011/0010608 A1 | 1/2011 | Kim et al. | |
| 2011/0154161 A1 | 6/2011 | Kim et al. | |
| 2015/0312002 A1 | 10/2015 | Liu et al. | |

FOREIGN PATENT DOCUMENTS

| | | |
|---|---|---|
| CN | 101884184 A | 11/2010 |
| CN | 101932008 A | 12/2010 |
| JP | 2003-529289 A | 9/2003 |
| JP | 2009-545228 A | 12/2009 |
| JP | 2010-514348 A | 4/2010 |
| KR | 2003-0086037 A | 11/2003 |
| KR | 10-2008-0084369 A | 9/2008 |
| KR | 10-2011-0005660 A | 1/2011 |
| KR | 10-2011-0070417 A | 6/2011 |
| WO | 01/74012 A1 | 10/2001 |

OTHER PUBLICATIONS

Schulzrinne et al., RTP: A Transport Protocol for Real-Time Applications, Jul. 2003, pp. 1-89.

* cited by examiner

APPARATUS AND METHOD FOR TRANSMITTING/RECEIVING FORWARD ERROR CORRECTION PACKET IN MOBILE COMMUNICATION SYSTEM

PRIORITY

This application claims the benefit under 35 U.S.C. § 119(a) of a Korean patent application filed on Oct. 13, 2011 in the Korean Intellectual Property Office and assigned Serial No. 10-2011-0104888, the entire disclosure of which is hereby incorporated by reference.

BACKGROUND OF THE INVENTION

1. Field of the Invention

The present invention relates to an apparatus and method for transmitting/receiving a packet in a mobile communication system. More particularly, the present invention relates to an apparatus and method for transmitting/receiving a Forward Error Correction (FEC) packet in a mobile communication system.

2. Description of the Related Art

Mobile communication systems have evolved to provide large-capacity content as well as a voice service. Large-capacity content includes High Definition (HD) content, Ultra High Definition (UHD) content, and the like.

FIG. 1 illustrates a process for transmitting/receiving a packet in a mobile communication system according to the related art.

Referring to FIG. 1, a process for transmitting a packet by a transmitter, for example, a host A 110 to a receiver, for example, a host B 140 through a router #1 120 and a router #2 120 is illustrated. A layer structure of each entity is illustrated under each of the entities in FIG. 1. Both the host A 110 and the host B 140 have a layer structure including an application layer, a transport layer, an internet layer, and a link layer, and both the router #1 120 and the router #2 130 have a layer structure including an internet layer and a link layer. For example, the host A 110 is connected to the router #1 120 through an Ethernet, the router #1 120 is connected to the router #2 130 through a fiber and a satellite, and the router #2 130 is connected to the host B 140 through the Ethernet.

A data format processed in each layer is described in view of the host A 110.

If data 151 occurs in the application layer, the application layer transfers the data 151 to the transport layer. For example, the data 151 may be a Real Time Protocol (RTP) packet, or a Moving Picture Experts Group (MPEG) Media Transport (MMT) packet. The RTP packet represents a packet which is generated by packetizing data compressed in an Audio Video Codec (AV Codec) using RTP.

The transport layer generates a User Datagram Protocol (UDP) packet including a UDP header 161 and UDP data 163 by processing the data 151, and transfers the generated UDP packet to the internet layer. The internet layer generates an Internet Protocol (IP) packet including an IP header 171 and IP data 173 by processing the UDP packet, and transfers the generated IP packet to the link layer. The link layer generates a link packet including a frame header 181, frame data 183, and a frame footer 185 by processing the IP packet.

Mobile communication systems provide various large-capacity contents, so data congestion on a network has increased. As a result, content transmitted by a transmitter are not completely transferred to a receiver, and some of the content is lost en route.

In general, data is transmitted on a packet basis, and accordingly data loss is generated on a transmission packet basis. Accordingly, the receiver cannot receive a lost transmission packet, and thus cannot receive data within the lost transmission packet.

Accordingly, there is a need for a method for reducing data loss due to transmission packet loss. A typical example of the method is a Forward Error Correction (FEC) scheme. The FEC scheme generates a parity block by encoding a source block including a predetermined number of packets using an FEC encoding scheme thereby transmitting the source block and the parity block, so error correction capability may be enhanced. A block including the source block and the parity block is referred to as an FEC packet. Each packet included in the source block includes a header, and each of the headers includes the same Application Layer FEC (AL-FEC) signaling information for AL-FEC signaling.

When the FEC packet is transmitted/received as described above, a signaling overhead for transmitting/receiving the header included in each of the packets included in the source block occurs. The signaling overhead may result in an FEC packet transmission/reception process delay as well as reducing radio resource efficiency of a mobile communication system.

Therefore, a need exists for a method for transmitting/receiving an FEC packet in order to reduce a signaling overhead due to a header transmission/reception.

SUMMARY OF THE INVENTION

Aspects of the present invention are to address at least the above-mentioned problems and/or disadvantages and to provide at least the advantages described below. Accordingly, an aspect of the present invention is to provide an apparatus and method for transmitting/receiving a Forward Error Correction (FEC) packet in a mobile communication system.

Another aspect of the present invention is to provide an FEC packet transmission/reception apparatus and method for reducing a signaling overhead due to a header transmission/reception in a mobile communication system.

Another aspect of the present invention is to provide an FEC packet transmission/reception apparatus and method for transmitting/receiving Application Layer (AL)-FEC signaling information through particular FEC packets, and not transmitting/receiving AL-FEC signaling information in every FEC packet in a mobile communication system.

In accordance with an aspect of the present invention, a method for transmitting an FEC packet by an FEC packet transmission apparatus in a mobile communication system is provided. The method includes transmitting an FEC delivery block to an FEC packet reception apparatus, wherein the FEC delivery block includes N payloads, wherein each of the N payloads includes a payload header, wherein each payload header included in each of C payloads among the N payloads includes packet oriented header information and an FEC delivery block oriented header information fragment, wherein the packet oriented header information is applied to a related payload, and wherein the FEC delivery block oriented header information fragment is generated by fragmenting FEC delivery block oriented header information applied to the N payloads.

In accordance with another aspect of the present invention, a method for receiving an FEC packet by an FEC packet reception apparatus in a mobile communication system is provided. The method includes receiving an FEC delivery block from an FEC packet transmission apparatus, wherein the FEC delivery block includes N payloads, wherein each of the N payloads includes a payload header, wherein each payload header included in each of C payloads among the N payloads includes packet oriented header information and an FEC delivery block oriented header information fragment, wherein the packet oriented header information is applied to a related payload, and wherein the FEC delivery block oriented header information fragment is generated by fragmenting FEC delivery block oriented header information applied to the N payloads.

In accordance with another aspect of the present invention, an FEC packet transmission apparatus in a mobile communication system is provided. The FEC packet transmission apparatus includes a transmitter for transmitting an FEC delivery block to an FEC packet reception apparatus, wherein the FEC delivery block includes N payloads, each of the N payloads includes a payload header, each payload header included in each of C payloads among the N payloads includes packet oriented header information and an FEC delivery block oriented header information fragment, wherein the packet oriented header information is applied to a related payload, and wherein the FEC delivery block oriented header information fragment is generated by fragmenting FEC delivery block oriented header information applied to the N payloads.

In accordance with another aspect of the present invention, an FEC packet reception apparatus in a mobile communication system is provided. The FEC packet reception apparatus includes a receiver for receiving an FEC delivery block from an FEC packet transmission apparatus, wherein the FEC delivery block includes N payloads, wherein each of the N payloads includes a payload header, wherein each payload header included in each of C payloads among the N payloads includes packet oriented header information and an FEC delivery block oriented header information fragment, wherein the packet oriented header information is applied to a related payload, and wherein the FEC delivery block oriented header information fragment is generated by fragmenting FEC delivery block oriented header information applied to the N payloads.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features and structures.

DETAILED DESCRIPTION OF EXEMPLARY EMBODIMENTS

Figure 1:
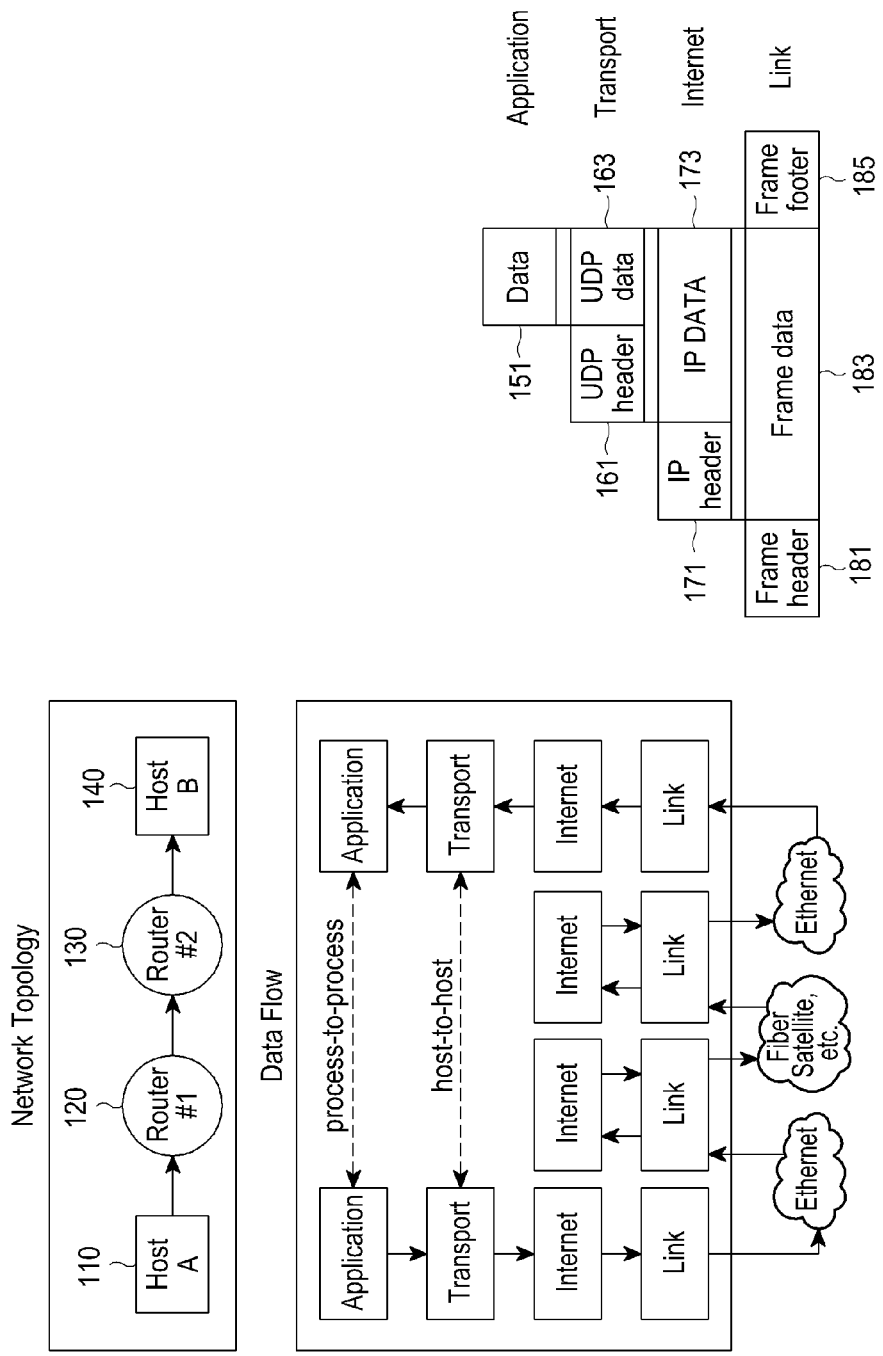
FIG. 1 illustrates a process for transmitting/receiving a packet in a mobile communication system according to the related art.

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

An exemplary embodiment of the present invention proposes an apparatus and method for transmitting/receiving a Forward Error Correction (FEC) packet in a mobile communication system. Another exemplary embodiment of the present invention proposes an FEC packet transmission/reception apparatus and method for reducing a signaling overhead due to a header transmission/reception in a mobile communication system. Another exemplary embodiment of the present invention proposes an FEC packet transmission/reception apparatus and method for transmitting/receiving Application Layer FEC (AL-FEC) signaling information through particular FEC packets, not transmitting/receiving AL-FEC signaling information per FEC packet in a mobile communication system.

Exemplary embodiments of the present invention are described below with reference to a mobile communication system, for example, an Evolved Packet System (EPS). However, it will be understood by those of ordinary skill in the art that the mobile communication system may also be a Long-Term Evolution (LTE) mobile communication system, a Long-Term Evolution Advanced (LTE-A) mobile communication system and an Institute of Electrical and Electronics Engineers (IEEE) 802.16m mobile communication system as well as the EPS.

For convenience, some terminology is defined below:

(1) FEC Code

The FEC code represents an error correction code used for correcting an error symbol or an erasure symbol.

(2) FEC Frame

The FEC frame represents a codeword which is generated by encoding an information word using an FEC encoding scheme. The FEC frame includes an information part and a parity part. The parity part is referred to as a repair part.

(3) Symbol

The symbol represents a unit of data, and has a symbol size in bits or bytes.

(4) Source Symbol

The source symbol represents an unprotected data symbol. The unprotected data symbol represents an original data symbol which may not be protected.

(5) Information Symbol

The information symbol represents one of an unprotected data symbol and a padding symbol included in an information part included in an FEC frame.

(6) Codeword

The codeword represents an FEC frame which is generated by encoding an information symbol using an FEC encoding scheme.

(7) Parity Symbol

The parity symbol is generated using an FEC encoding scheme based on an information symbol. The parity symbol is included in an FEC frame.

(8) Packet

The packet represents a transmission unit of data including a header and a payload.

(9) Payload

The payload is included in a packet and represents a part of a user data to be transmitted in a transmitter.

(10) Packet Header

The packet header represents a header included in a packet.

(11) Source Payload

The source payload represents a payload including source symbols, and a unit which is protected by an FEC scheme.

If a D2 header is protected using an FEC scheme, the source payload is a Moving Picture Experts Group (MPEG) Media Transport (MMT) transport packet. If the D2 header is not protected using the FEC scheme, the source payload is an MMT transport format. For convenience, an FEC scheme for protecting the D2 header is referred to as D2-FEC scheme, and an FEC scheme for not protecting the D2 header is referred to as D1-FEC scheme.

In the D2-FEC scheme, a MMT transport packet is used for interfacing with an underlying layer. A source payload may be an MMT transport packet, and the MMT transport packet includes a D2 header and an MMT payload (source payload=MMT transport packet (=D2 header+MMT payload format)).

The source payload and an FEC in-band signal included in an MMT transport packet are transmitted after FEC protection. The MMT transport packet is modified to include the FEC in-band signal. The MMT transport packet after the FEC protection includes a D2 header, an FEC in-band signal and an MMT payload format (MMT transport packet=D2 header+FEC in-band signal+MMT payload format). The FEC in-band signal is located behind the D2 header or the MMT payload format.

The MMT transport packet is expressed below:

MMT transport packet=$D2$ header+($D1$ header)+FEC in-band signal+parity payload In the D1-FEC scheme, an MMT payload format is used for interfacing with a D2 layer. A source payload may be an MMT payload format, and the payload format includes a D1 header and a payload (source payload=MMT payload format (=D1 header+payload)).

The source payload and an FEC in-band signal included in an MMT payload format are transmitted to a D2 layer or an application protocol layer, i.e., a Real Time Protocol (RTP) layer after an FEC protection. The MMT payload format is modified to include the FEC in-band signal. The MMT payload format after the FEC protection includes a D1 header, an FEC in-band signal and a payload (MMT payload format=D1 header+FEC in-band signal+payload). The FEC in-band signal is located behind the D1 header or the payload.

The MMT payload format is expressed below:

MMT payload format=$D1$ header+FEC in-band signal+parity payload

(12) Information Payload

The information payload represents a payload including information symbols.

(13) Parity Payload

The parity payload represents a payload including parity symbols.

(14) Source Block

The source block includes at least one source payload, for example, K source payloads. The source block may be converted into an information block for FEC protection.

(15) Information Block

The information block includes at least one information payload. The information block includes at least one information payload which is generated by converting a source block. The number of information payloads included in the information block may be changed according to an Information Block Generation (IBG) mode. For example, if the IBG mode is one of an IBG_mode0 and an IBG_mode1, the number of information payloads included in the information block may be equal to the number of source payloads included in the source block K, and the number of the information payloads included in the information block may not be equal to K if the IBG mode is not the IBG_mode0 and the IBG_mode1.

The IBG_mode0 represents an IBG mode which is applied if lengths of source payloads are the same, that is, a length of a source payload is fixed and a source block is identical to an information block.

The IBG_mode1 represents one of IBG modes which apply if a length of a source payload is variable. In the IBG_mode1, information blocks of which sizes are the same are generated by adding padding data to source payloads respectively. The number of source payloads included in a source block is equal to the number of information payloads included in an information block. The length of the source payload is variable, so virtual length information is needed for each of the source payloads.

(16) Repair Block

The repair block includes at least one repair payload, for example, P repair payloads. The repair block is referred to as a parity block.

(17) FEC Block

The FEC block includes at least one codeword or at least one payload including an information block and a parity block.

(18) FEC Delivery Block

The FEC delivery block includes at least one payload including a source block and a repair block.

(19) FEC Packet

The FEC packet represents a packet used for transmitting an FEC block.

(20) Source Packet

The source packet represents a packet used for transmitting a source block.

(21) Parity Packet

The parity packet represents a packet used for transmitting a repair block.

(22) FEC Packet Block

The FEC packet block includes at least one packet used for transmitting an FEC delivery block.

(23) MMT Package

The MMT package includes at least one MMT asset. MMT assets may include a video asset, an audio asset, a widget asset, and the like.

(24) MMT Asset

The MMT asset includes at least one Media Processing Unit (MPU). The MPU is converted into at least one MMT payload format by packetizing the MPU according to a size of the MPU. According to a size of a Maximum Transport Unit (MTU), the MPU is converted into one MMT payload, a plurality of MMT payloads which are generated by fragmenting the MPU, or one MMT payload including a plurality of MPUs that are generated by aggregating the plurality of MPUs.

Exemplary embodiments of the present invention propose an apparatus and method for transmitting/receiving an FEC Packet by considering a signaling overhead due to a header transmission/reception.

In a mobile communication system according to the related art, header information included in each FEC packet included in an FEC packet block used for transmitting an FEC delivery block includes AL-FEC signaling information. The AL-FEC signaling information is fixed information in a related FEC delivery block, so transmitting the AL-FEC signaling information in each FEC packet is ineffective.

According to an exemplary embodiment of the present invention, header information is divided into FEC packet oriented information and FEC packet block oriented information in the FEC packet block.

The FEC packet oriented information may be different in each FEC packet and may be included in a header included in each FEC packet. The FEC packet block oriented information is fragmented into a plurality of FEC packet block oriented information parts. The plurality of the FEC packet block oriented information parts are included in headers included in the FEC packet block to enable an EPS packet reception apparatus to identify the FEC packet block oriented information.

For convenience, a header included in the FEC packet block is referred to as an FEC packet block header, and a header included in the FEC packet is referred to as an FEC packet header.

If an add rate of the FEC packet block is 20% and the FEC packet block oriented information includes 12 bytes, then the FEC packet block oriented information is fragmented into two FEC packet block oriented information parts each including 6 bytes, and the two FEC packet block oriented information parts are included in two consecutive FEC packet headers. If the add rate of the FEC packet block is 20% and the FEC packet block oriented information includes 12 bytes, then the FEC packet block oriented information is fragmented into three FEC packet block oriented information parts each including 4 bytes, and the three FEC packet block oriented information parts are included in three consecutive FEC packet headers. In both of these cases, a signaling overhead due to the FEC signal info may be reduced, and an FEC repair is possible up to a maximum of FEC packet loss 20% since the add rate of the FEC packet block is 20%. This is why the FEC packet reception apparatus may identify the FEC packet block oriented information upon at least two or at least three consecutive FEC packets.

The FEC packet block oriented information may include the number of source payloads K included in a source block, the number of parity payloads P included in a parity block or the number of payloads N=K+P included in an FEC delivery block, FEC delivery block boundary information, FEC structure information indicating whether an FEC scheme is applied and indicating a structure, FEC type information indicating a used FEC code, maximum payload length information indicating a maximum length of one among payloads included in an FEC delivery block, shortening information, puncturing information, source block size information indicating the number of total bytes of data included in the source block, the first information indicating whether lengths of source payloads included in the source block are variable or fixed, information indicating whether the FEC packet transmission apparatus generates an information block by performing a padding operation on each source payload, or a two-dimensional array including padding values in a remaining part if the first information indicates the lengths of source payloads included in the source block are variable, and the like.

Figure 2:
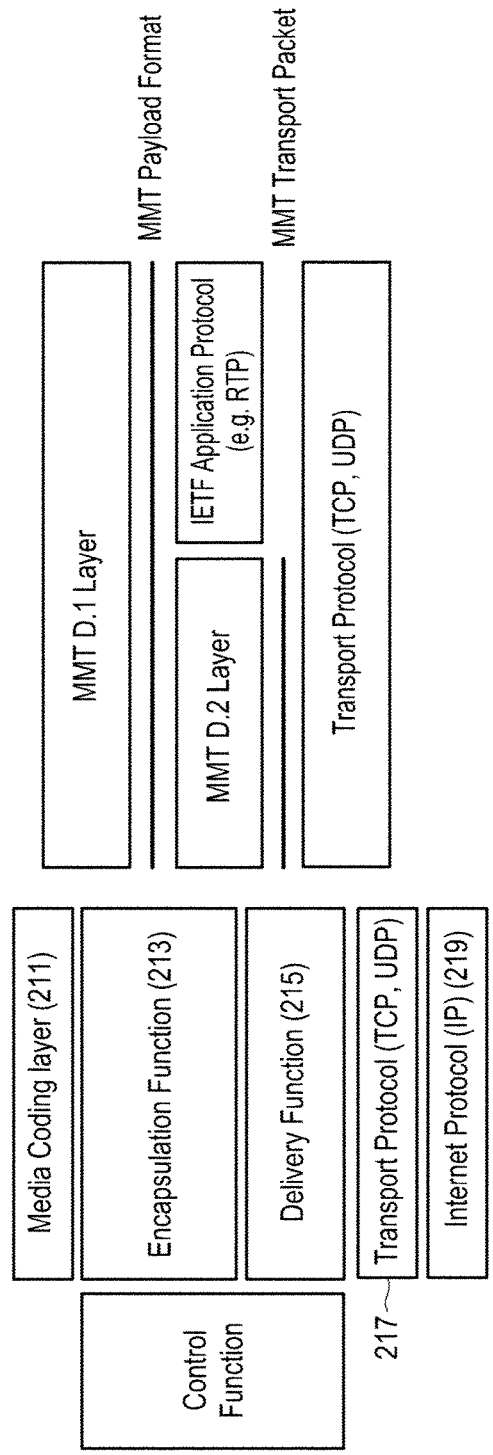
FIG. 2 illustrates a structure of an MPEG Media Transport (MMT) system and a delivery function layer according to an exemplary embodiment of the present invention.

FIG. 2 illustrates a structure of an MMT system and a delivery function layer according to an exemplary embodiment of the present invention.

Referring to FIG. 2, audio/video data compressed in a media coding layer 211 is packaged in a similar form of a file format and output in an encapsulation function layer (E layer) 213.

A delivery function layer 215 converts the data output from the E layer 213 into an MMT payload format, generates an MMT transport packet by adding an MMT transport packet header to the MMT payload format, and outputs the MMT transport packet. The delivery function layer 215 converts the MMT payload format into a RTP packet using a RTP, and outputs the RTP packet.

The MMT transport packet or the RTP packet output from the delivery function layer 215 is converted into an Internet Protocol (IP) packet. The IP packet is transmitted in an IP layer 219 through a protocol layer 217 of User Datagram Protocol (UDP)/Transport Control Protocol (TCP).

Figure 3:
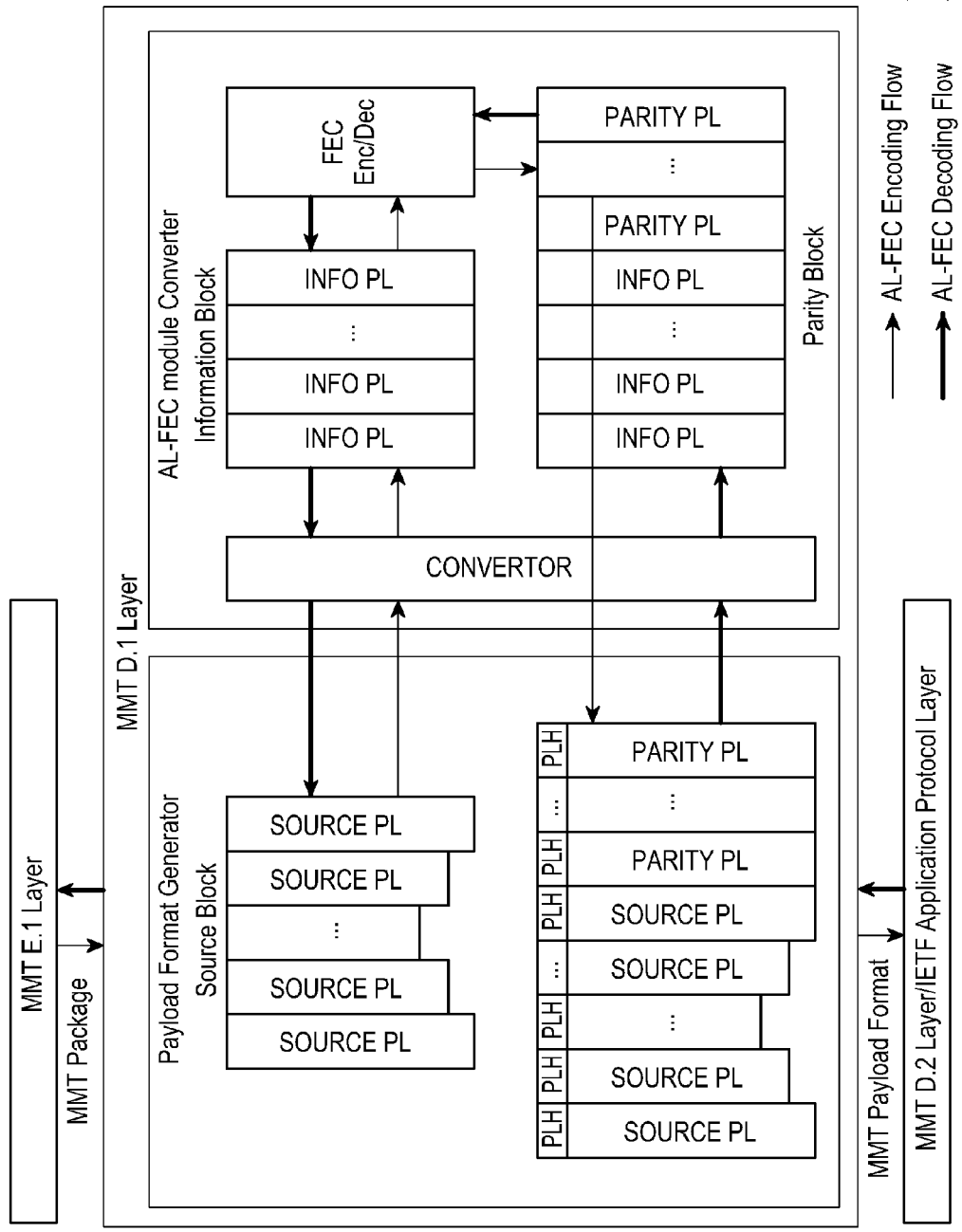
FIG. 3 illustrates a process for encoding/decoding an Application Layer Forward Error Correction (AL-FEC) source block in an FEC packet transmission/reception apparatus of an MMT system according to an exemplary embodiment of the present invention.

FIG. 3 illustrates a process for encoding/decoding an AL-FEC source block in an FEC packet transmission/reception apparatus of an MMT system according to an exemplary embodiment of the present invention.

Referring to FIG. 3, an operation performed in an FEC packet transmission apparatus, i.e., an AL-FEC source block encoding operation is illustrated.

Upon encoding an AL-FEC source block, an MMT D.1 layer receives an MMT package (a format generated for storing Audio/Video (AV) data, file, text and the like on a storage unit or transmitting the AV data, file, text and the like) from an MMT E.1 Layer, and generates source blocks by fragmenting the received MMT package on a preset unit basis, for example, on a source payload basis. As described above, the MMT package includes at least one MMT asset. An Audio asset is an MMT asset transmitting audio data, and a video asset is an MMT asset transmitting video data.

An AL-FEC module convertor converts a source block into an information block as a two-dimensional array including information payloads which have the same length. An FEC encoder generates a parity block by performing an FEC encoding operation based on an information block according to a preset FEC code, and transfers the parity block to a payload format generator. The payload format generator transmits an MMT payload format which is generated by adding the parity block to a source block and adding a payload header (PLH) to each payload to an MMT D.2 layer/Internet Engineering Task Force (IETF) application protocol layer.

As described in FIG. 1, in the MMT D.2 layer/IETF application protocol layer, a UDP header and an IP header are added to the MMT payload format through a transport protocol such as a UDP, and the MMT payload format to which the UDP header and the IP header are added are transmitted.

An FEC packet reception apparatus performs an AL-FEC source block decoding operation using an inverse operation to the AL-FEC source block encoding operation performed in the FEC packet transmission apparatus.

Figure 4:
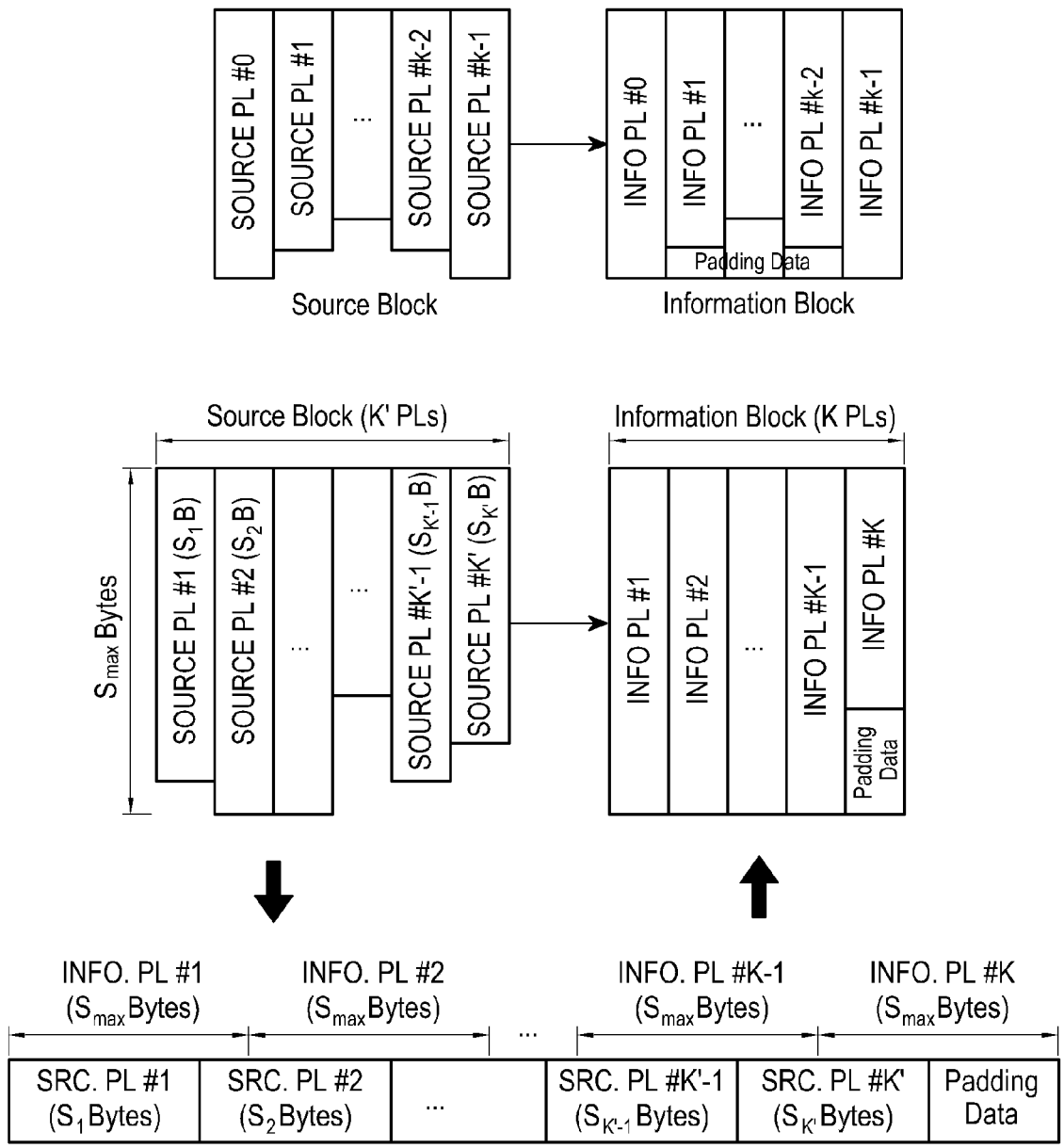
FIG. 4 illustrates a process for converting a source block into an information block in an FEC packet transmission apparatus of an MMT system according to an exemplary embodiment of the present invention.

FIG. 4 illustrates a process for converting a source block into an information block in an FEC packet transmission apparatus of an MMT system according to an exemplary embodiment of the present invention.

Referring to FIG. 4, an information block, including K information payloads which have the same length by adding padding data to each payload included in a source block including K source payloads, is illustrated. The adding operation is performed if necessary. An information block, including K information payloads which have the same length by adding padding data to a concatenated source block which are generated by concatenating source blocks each including K' source payloads, is illustrated in FIG. 4. The adding operation is performed if necessary.

In an MMT system according to an exemplary embodiment of the present invention, an information block may be generated by performing a padding operation on each source payload included in a source block, or adding padding data to the remain part after storing the source payloads in a two-dimensional array.

Figure 5A:
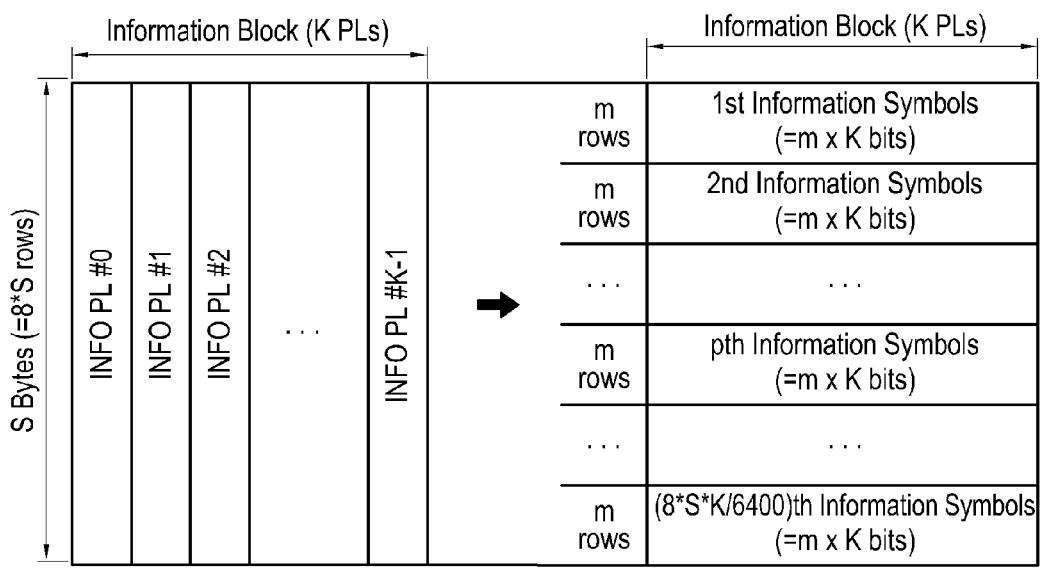
FIGS. 5A-5B illustrate an information symbol mapping process in an FEC packet transmission apparatus of an MMT system according to an exemplary embodiment of the present invention.
Figure 5B:
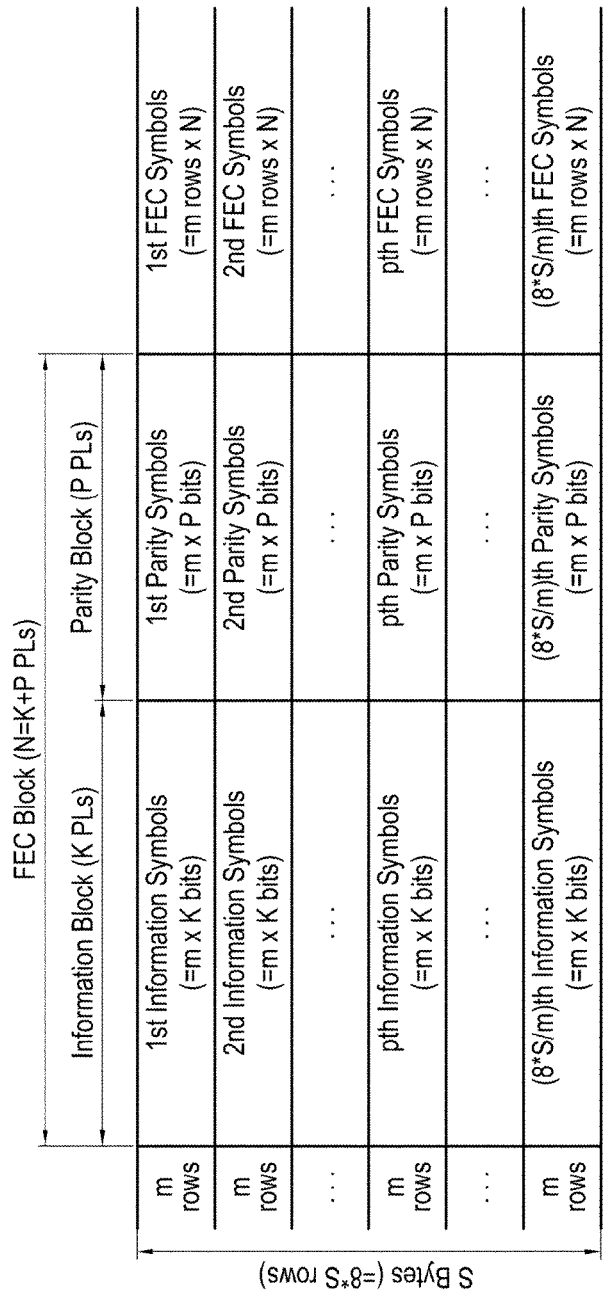

FIGS. 5A-5B illustrate an information symbol mapping process in an FEC packet transmission apparatus of an MMT system according to an exemplary embodiment of the present invention.

Referring to FIGS. 5A-5B, an FEC block including a parity block generated based on an information block including K information payloads is illustrated. The information block includes information symbols including m rows respectively, and P parity symbols are generated corresponding to the information symbols and a given FEC code. Each of the information symbols includes m×K bits, and each of the parity symbols includes m×P bits.

Afterwards an FEC frame including the information symbols and the parity symbols is generated. The FEC frame includes N FEC symbols, and each of the N FEC symbols includes m×N bits. The m is expressed as 8*S, and indicates an positive divisor. In FIGS. 5A-5B, PL represents a payload.

Figure 6:
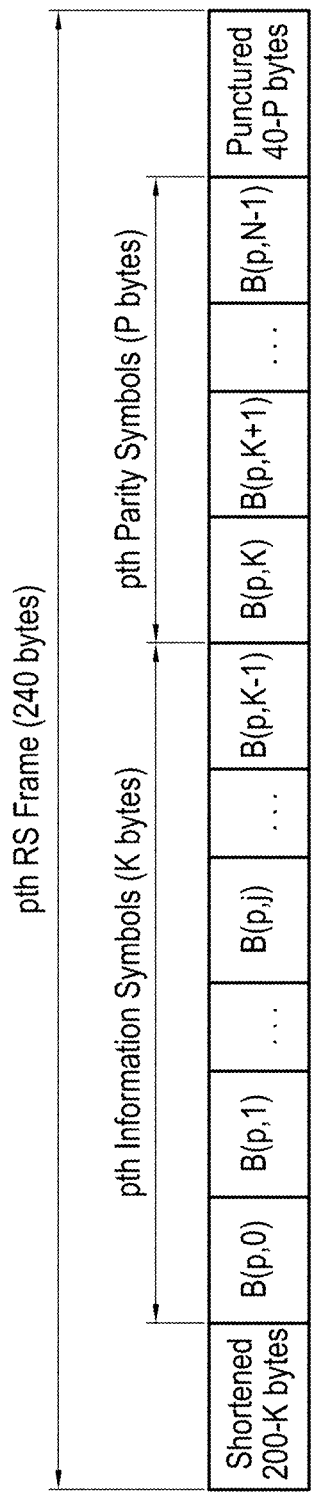
FIG. 6 illustrates a Reed Solomon (RS) frame configuration process in an FEC packet transmission apparatus of an MMT system according to an exemplary embodiment of the present invention.

FIG. 6 illustrates a Reed Solomon (RS) frame configuration process in an FEC packet transmission apparatus of an MMT system according to an exemplary embodiment of the present invention.

Referring to FIG. 6, a structure of a radio frequency (RF) frame which uses a Reed-Solomon (RS) (240,200) code over a Galois Field (GF) (2^8) if m is 8 (m=8) is illustrated.

In this case, the pth row of an information block including K payloads becomes the pth information symbols K bytes, the pth RS frame is generated by generating parity bytes 40 bytes after 200-K bytes are padded with 00h and an encoding operation is performed. Information symbols K bytes and parity symbols P bytes are transmitted after the first 200-K padding bytes are shortened and the last 40-P bytes are punctured.

Figure 7:
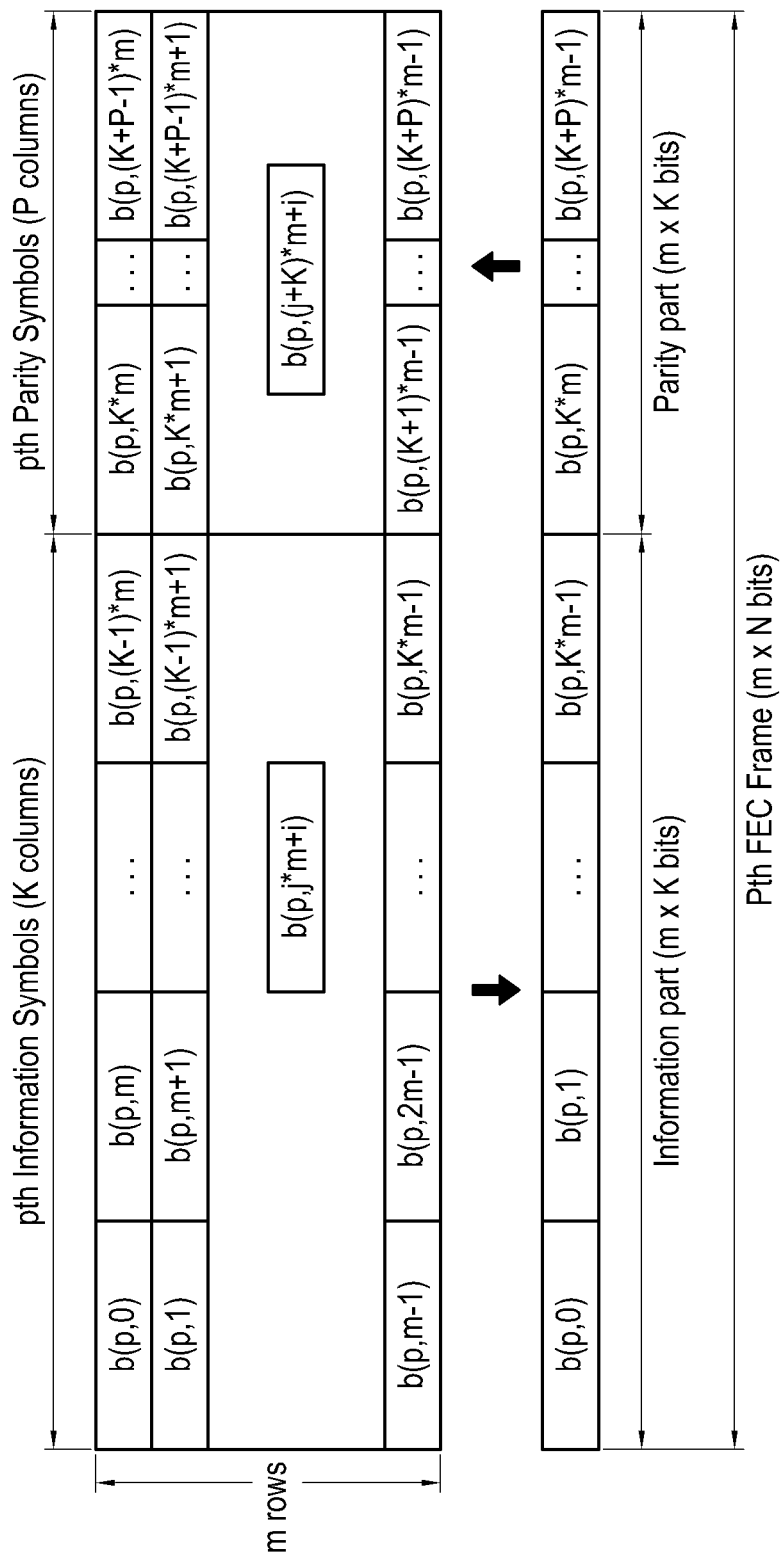
FIG. 7 illustrates a Low Density Parity Check (LDPC) frame configuration process in an FEC packet transmission apparatus of an MMT system according to an exemplary embodiment of the present invention.

FIG. 7 illustrates a Low Density Parity Check (LDPC) frame configuration process in an FEC packet transmission apparatus of an MMT system according to an exemplary embodiment of the present invention.

Referring to FIG. 7, an LDPC frame using a (m×(K+P), m×K) LDPC over a GF(2) is illustrated. The pth m row(s) of an information block including K payloads becomes the pth information symbols m×K bits, the pth LDPC frame is generated by generating m×P parity bits, and the m×P parity bits are generated as parity symbols. m represents a positive integer.

In FIG. 7, if m is greater than 1, an index is allocated from top to bottom and from left to right. However, it will be understood by those of ordinary skill in the art that the index may be allocated from bottom to top and from right to left.

Figure 8:
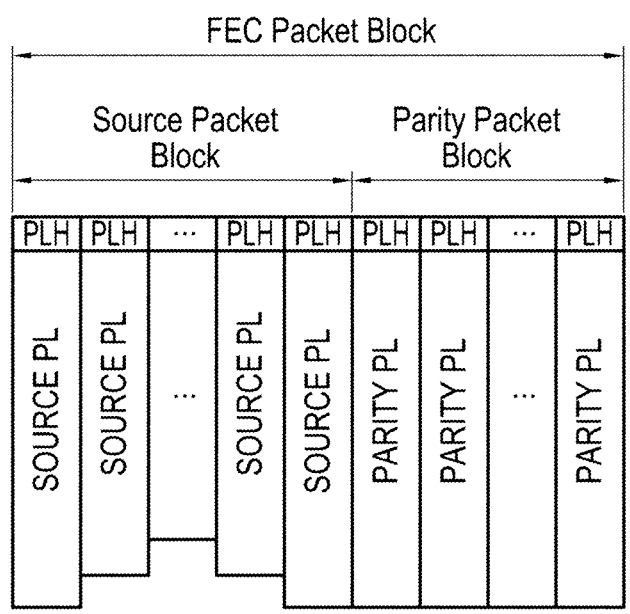
FIG. 8 illustrates an FEC delivery block configuration process in an FEC packet transmission apparatus of an MMT system according to an exemplary embodiment of the present invention.

FIG. 8 illustrates an FEC delivery block configuration process in an FEC packet transmission apparatus of an MMT system according to an exemplary embodiment of the present invention.

Referring to FIG. 8, an FEC packet block which is generated by adding a header to each payload included in an FEC Delivery Block is illustrated in FIG. 8.

An MMT payload format is expressed in Table 1.

TABLE 1

| payload header | MMT payload (source payload or parity payload) |

In Table 1, the source payload may be an MMT payload format or an MMT transport packet.

A format of information transmitted through a payload header is expressed in Table 2.

TABLE 2

| Packet oriented header information | payload type |
| --- | --- |
|  | sequence number |
|  | FEC flag |
| FEC delivery block oriented header information | block boundary info |
|  | source block size |
|  | maximum payload size |
|  | source block length: K |
|  | parity block length: P |

In Table 2, payload header information is an FEC signal, and includes packet oriented header information and FEC delivery block oriented header information. The packet oriented header information is included in each packet. The FEC delivery block oriented header information is divided into a plurality of FEC delivery block oriented header information parts, and the plurality of the FEC delivery block oriented header information parts are included in a plurality of packet headers.

The payload type represents whether a payload of a related MMT payload format is a source payload or a parity payload, and the source payload may be are classified into audio, video, text and the like.

The sequence number is allocated in an ascending order or a descending order in order to indicate an order of payloads to be transmitted, so the sequence number may be used to determine whether a packet has been lost. The sequence number may be omitted if the sequence number is included in an application protocol header (for example, an MMT packet header or a RTP header).

The FEC flag indicates whether an FEC scheme has been applied. For example, if a value of the FEC flag is set to 0, a source block is transmitted and the FEC scheme has not been applied. If a value of the FEC flag is set to 1, a source block is transmitted with a parity block for repairing the source block, the FEC scheme has been applied, and the FEC delivery oriented header information is included in the header.

The block boundary info represents a boundary of an FEC delivery block, and a sequence number of the first source payload included in the FEC delivery block is allocated to all headers. The block boundary info is a type of an FEC delivery block ID, and may be included in headers of all payloads included in the FEC delivery block.

The source block size represents a size of data included in a source block, for example, the number of bytes. The source block size represents a total sum of sizes of source payloads.

The maximum payload size represents a size of data included in a payload with a maximum size among from payloads included in a source block, for example, the number of bytes.

The source block length represents the number of source payloads included in a source block.

The parity block length represents the number of parity payloads included in a parity block. A process for fragmenting FEC delivery block oriented header information (FEC signal info) is described below.

If the FEC signal info is fragmented into a plurality of FEC signal info parts and the plurality of the FEC signal info parts are included in headers, then the requirement is that a situation on which the FEC packet reception apparatus may not accurately acquire the FEC signal info due to a packet loss should not occur even though the FEC packet reception apparatus may repair the plurality of the FEC signal info parts based on a parity block if the packet loss occurs on the FEC delivery block. Even if a maximum number of recoverable packets have been lost, the FEC signal info should be fragmented thereby enable the FEC packet reception apparatus to accurately acquire the FEC signal info.

For example, if an FEC delivery block length is N (FEC delivery block length=N) and an add rate is r, a maximum of floor (N×r)=PL lost packets may be repaired. If floor (N/PL) is D (floor (N/PL)=D), the requirement is satisfied in a case that the FEC signal info is fragmented into C FEC signal info parts and the C FEC signal info parts are transmitted through C headers. Here, C is less than D.

For example, if N=240, r=1/6, then PL=floor (N×r)=40 and D=floor (N/PL)=6. The requirement is satisfied if an FEC packet transmission apparatus fragments the FEC signal info into 5 FEC signal info parts and transmits 5 headers which include 5 FEC signal info parts respectively. Accordingly, an FEC packet reception apparatus may acquire the FEC signal info by receiving 5 consecutive packets if the FEC packet transmission apparatus fragments the FEC signal info into 5 FEC signal info parts and transmits 5 headers which include 5 FEC signal info parts respectively.

If at least one packet per 5 consecutive packets is lost, the FEC packet reception apparatus may not receive 5 consecutive packets, so 48 packets among from 240 packets are lost. In this case, it does not matter if the FEC signal info is not repaired since the FEC delivery block is beyond a repair range of an FEC.

If the number of source payloads included in a source block K=200, the number of parity payloads included in a parity block P=20, and a maximum size of a payload is 1000 bytes, then a size of data need for FEC signal info is expressed as
(1) block boundary info: 2 bytes
(2) source block size: 4 bytes
(3) maximum payload size: 2 bytes
(4) source block length: 2 bytes
(5) parity block length: 2 bytes As described above, a size of data necessary for the FEC signal info is 12 bytes. In this case, a maximum number of recoverable packets is 20 and 220/20=11, so the FEC signal info 12 bytes is fragmented into B FEC signal info parts, and the B FEC signal info parts are included in B consecutive headers. B is less than or equal to 10.

The FEC packet transmission apparatus includes 12 bytes to 6 consecutive packet headers on a 2 byte basis since transmission is performed on network bytes basis.

If the FEC signal info is fragmented into an FECS_Part0, an FECS_Part1, . . . , an FECS_Partd−1, then a header format may be expressed as Table 3.

TABLE 3

| | |
|---|---|
| payload type | |
| sequence number | |
| FEC flag | |
| If FEC flag==1 | FECS_Part ID = i |
| | FECS_Part size = n |
| | for (j=1 ; j< n+1; j++) |
| | jth byte of FECS_Part i |

In Table 3, "FEC flag==1" indicates that an FEC scheme has been applied, and the FECS_Part ID represents an FECS_Parti included in a related header. In Table 3, the FECS_Part represents an FEC signal info part, and i represents an FEC signal info part ID.

The FECS_Part size represents a size of an FECS_Part included in a related header. The FECS_Part size is expressed on a byte basis. However it will be understood by those of ordinary skill in the art that the FECS_Part size may also expressed on a bit basis.

For example, in an MMT system in which a size of the FEC signal info is 32 bytes and in which the FEC signal info may be fragmented into 8 FEC signal info parts, an FECS_Part ID may be implemented as 3 bits and an FECS_Part Size may be implemented as 5 bits. The FECS_Part ID indicates bytes of an FECS_Part i included in a related header, and the FECS_Part Size indicates bytes of an FECS_Part Size included in the related header. For example, if FECS_Part ID=i and FECS_Part Size=j, an FECS_Part i of which a size is 5 bytes is included in a related header.

The FEC packet transmission apparatus transmits the first header including an FECS_Part0, the second header including an FECS_Part1. The FEC packet transmission apparatus transmits the eighth header including an FECS_Part7, and the ninth header including an FECS_Part0. The FEC packet transmission apparatus may transmit FECS_Parts using consecutive headers in a consecutive order.

As described above, if the size of the FEC signal info and the number of FECS_Parts are not predetermined, and the size of the FEC signal info and the number of FECS_Parts are variable depending to a situation, the FEC packet reception apparatus should acquire the size of the FEC signal info and the number of FECS_Parts from received header information. In this case, a payload header format according to an exemplary embodiment of the present invention may be expressed in Table 4.

TABLE 4

| payload type | |
|---|---|
| sequence number | |
| FEC flag | |
| If FEC flag==1 | FEC signal info size |
| | number of FECS_Part |
| | FECS_Part ID = i |
| | FECS_Part size = n |
| | for (j=1 ; j< n+1; j++) |
| | jth byte of FECS_Part i |

For the case that the FEC signal info size and the number of the FECS_Part are variable, Table 4 further includes two fields compared with Table 3.

The added fields in Table 4 are described below.

(1) FEC Signal Info Size

The FEC signal info size represents the number of bytes (bits) included in the FEC signal info. The FEC signal info size should be set in order to cover the maximum number of bytes (bits) of FEC signal info supported by an MMT system. For example, if the maximum number of bytes (bits) of the FEC signal info is 32, the FEC signal info size should be implemented as 5 bits. If a value of the FEC signal info size is j, then the FEC signal info has a size in j+1 bytes (bits).

(2) Number of FECS_Part

The Number of FECS_Part indicates the number of FECS_Parts. The Number of FECS_Part should be set in order to cover a maximum number which an MMT system supports. For example, if the maximum number of the FECS_Parts is 8, the Number of FECS_Part should be implemented as 3 bits. If the Number of FECS_Part is j, the FEC signal info is fragmented into j+1 FECS_Parts.

If the number of the FECS_Parts is fixed and there are applied FEC schemes, the FEC signal info may become different according to each of the applied FEC schemes. A payload header format for a case that the number of the FECS_Parts is fixed and an applied FEC scheme is variable is expressed in Table 5.

TABLE 5

| payload type | |
|---|---|
| sequence number | |
| FEC flag | |
| If FEC flag==1 or flag==2 or flag==3 | FECS_Part ID = i |
| | FECS_Part i |

In Table 5, a payload header format for a case that the number of the FECS_Parts is fixed and an applied FEC scheme is variable is expressed.

(1) FEC Flag

The FEC flag indicates whether an FEC scheme has been applied, and indicates a type of the FEC scheme if the FEC scheme has been applied.

For example, the FEC scheme has not been applied if a value of the FEC flag is set to 0, the first FEC scheme has been applied if the value of the FEC flag is set to 1, the second FEC scheme has been applied if the value of the FEC flag is set to 2, and the third FEC scheme has been applied if the value of the FEC flag is set to 3.

A size of FEC signal info and the number of FECS_Parts according to each of the FEC schemes is predetermined. An FEC packet reception apparatus may determine the size of FEC signal info and the number of FECS_Parts based on the FEC flag.

(2) FECS_Part ID

The FECS_Part ID is implemented as bits which may cover the number of FECS_Parts since the number of FECS_Parts is predetermined. The FECS_Part ID indicates which FECS_Part is transmitted in a related header.

For example, if the number of FECS_Parts is 2 in each of the first to third FEC schemes, and the size of FEC Signal Info is one of 4 bytes (for the first FEC scheme), 6 bytes (for the second FEC scheme), and 10 bytes (for the third FEC scheme), then an FECS_Part0 includes one of the first 2 bytes of each FEC Signal Info (for the first FEC scheme), the first 3 bytes of each FEC Signal Info (for the second FEC scheme) and the first 5 bytes of each FEC Signal Info (for the third FEC scheme). Similarly, an FECS_Part1 includes one of the remaining 2 bytes of each FEC Signal Info (for the first FEC scheme), the remaining 3 bytes of each FEC Signal Info (for the second FEC scheme), and the remaining 5 bytes of each FEC Signal Info (for the third FEC scheme). For example, if the FECS_Part ID is implemented as 1 bit, the FECS_Part ID indicates that an FECS_Part 0 is included in a related header if a value of the FECS_Part ID is set to 0, and the FECS_Part ID indicates that an FECS_Part1 is included in a related header if the value of the FECS_Part ID is set to 1.

In FIG. 3, a payload format generator fragments the FEC Signal Info according to an FEC add rate, generates a payload header by including an FECS_Part to a header, generates an MMT payload format by adding the header to each payload included in an FEC delivery block, and transmits the MMT payload format.

According to exemplary embodiments of the present invention, the FEC signal info is included in the D.1 payload format header. However, it will be understood by those of ordinary skill in the art that the FEC signal info may be included in an MMT protocol header or an application protocol header such as a RTP. It is possible that a fragmented FECS_Part is included in the MMT protocol header or the application protocol header such as the RTP.

If the add rate is less than 50%, the FEC signal info is fragmented into two consecutive packet headers, so a signaling overhead due to the FEC signal info may be reduced by as much as 50%.

If the add rate is less than 25%, the FEC signal info is fragmented into four consecutive packet headers, so a signaling overhead due to the FEC signal info may be reduced by as much as 75%.

Figure 9:
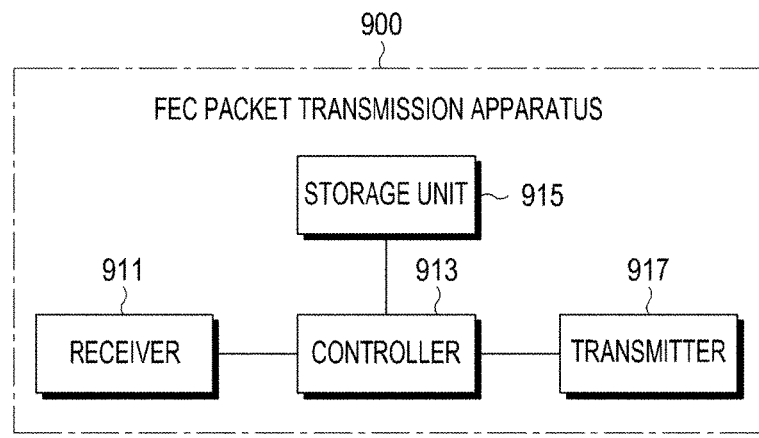
FIG. 9 is a block diagram illustrating an internal structure of an FEC packet transmission apparatus in an MMT system according to an exemplary embodiment of the present invention.

FIG. 9 is a block diagram illustrating an internal structure of an FEC packet transmission apparatus in an MMT system according to an exemplary embodiment of the present invention.

Referring to FIG. 9, an FEC packet transmission apparatus 900 includes a receiver 911, a controller 913, a storage unit 915, and a transmitter 917. The FEC packet transmission apparatus may include additional components which, for convenience and clarity, are not shown here.

The controller 913 controls the overall operation of the FEC packet transmission apparatus 900. The controller 913 controls the FEC packet transmission apparatus 900 to transmit headers, which are included in particular payloads, including related FEC signal info fragments which are generated by fragmenting the FEC signal info, and not transmit headers, which are included in all of payloads included in an FEC delivery block, including the same overall FEC signal info. The operation of transmitting the headers including the related FEC signal info fragments is performed in the manner described above with reference to FIGS. 2 to 8 and Tables 1 to 5, so the detailed description will be omitted.

The receiver 911 receives messages under a control of the controller 913.

The storage unit 915 stores the messages received by the receiver 911 and data required for an operation of the FEC packet transmission apparatus 900.

The transmitter 917 transmits messages and FEC delivery blocks under the control of the controller 913.

While the receiver 911, the controller 913, the storage unit 915, and the transmitter 917 are shown in FIG. 9 as separate units, it is to be understood that this is for merely convenience of description. The receiver 911, the controller 913, the storage unit 915, and the transmitter 917 may be incorporated into a single unit.

Figure 10:
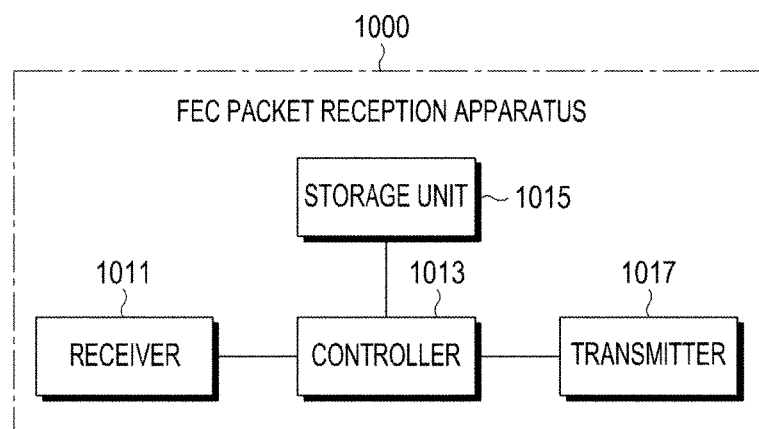
FIG. 10 is a block diagram illustrating an internal structure of an FEC packet reception apparatus in an MMT system according to an exemplary embodiment of the present invention.

FIG. 10 is a block diagram illustrating an internal structure of an FEC packet reception apparatus in an MMT system according to an exemplary embodiment of the present invention.

Referring to FIG. 10, an FEC packet reception apparatus 1000 includes a receiver 1011, a controller 1013, a storage unit 1015, and a transmitter 1017. The FEC packet reception apparatus 1000 may also include additional units which, for convenience and clarity, are not shown here.

The controller 1013 controls the overall operation of the FEC packet reception apparatus 1000. The controller 1013 controls the FEC packet reception apparatus 1000 to receive an FEC delivery block including headers including FEC signal info fragments. Herein, the FEC signal info fragments are generated by an FEC packet transmission apparatus 900, and the FEC packet transmission apparatus 900 generates the FEC signal info fragments as described in FIG. 9. The operation of receiving the FEC delivery block including the headers including the FEC signal info fragments is performed in the manner described before with reference to FIGS. 2 to 8 and Tables 1 to 5, so the detailed description will be omitted herein.

The receiver 1011 receives messages and FEC delivery blocks under a control of the controller 1013.

The storage unit 1015 stores the messages and the FEC delivery blocks received by the receiver 1011 and data required for an operation of the FEC packet reception apparatus 1000.

The transmitter 1017 transmits messages under the control of the controller 1013.

While the receiver 1011, the controller 1013, the storage unit 1015, and the transmitter 1017 are shown in FIG. 10 as separate units, it is to be understood that this is for merely convenience of description. The receiver 1011, the controller 1013, the storage unit 1015, and the transmitter 1017 may be incorporated into a single unit.

While not described in the figures, each entity which performs an operation of transmitting/receiving an FEC packet in an MMT system according to exemplary embodiments of the present invention may include a transmitter, receiver, storage unit, and controller for performing a related operation according to exemplary embodiments of the present invention. However, it will be understood by those of ordinary skill in the art that the transmitter, the receiver, the storage unit, and the controller may be incorporated into a single unit.

As is apparent from the foregoing description, exemplary embodiments of the present invention enable an FEC packet transmission/reception for minimizing a signaling overhead due to a header transmission/reception, so radio resource efficiency of a mobile communication system is enhanced, and packet transmission/reception process delay is prohibited.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for sending forward error correction (FEC) related information by a sending apparatus in a multimedia system, the method comprising:
    sending FEC related information for an FEC packet in the FEC packet,
    wherein the FEC related information includes information identifying an FEC coding structure, and
    wherein the information identifying the FEC coding structure indicates one of that application layer (AL)-FEC is not applied, that the FEC coding structure for the FEC packet is a first FEC coding structure if the first FEC coding structure is applied, that the FEC coding structure for the FEC packet is a second FEC coding structure if the second FEC coding structure is applied, or that the FEC coding structure for the FEC packet is a third FEC coding structure if the third FEC coding structure is applied.

2. The method of claim 1, wherein the FEC packet includes one of an FEC source symbol and an FEC repair symbol.

* * * * *